US005198966A

United States Patent [19]

Kobayashi et al.

[11] Patent Number: 5,198,966

[45] Date of Patent: Mar. 30, 1993

[54] APPARATUS INCLUDING A ROTATABLE LATCH MECHANISM HAVING AN ATTACHING STRUCTURE FOR HOLDING A MOVABLE MEMBER IN A CLOSED POSITION

[75] Inventors: Takaichi Kobayashi; Mitsuhiro Yoshida, both of Tokyo, Japan

[73] Assignee: Kabushiki Kaisha Toshiba, Kawasaki, Japan

[21] Appl. No.: 717,838

[22] Filed: Jun. 21, 1991

[30] Foreign Application Priority Data

Jun. 22, 1990 [JP] Japan .................................. 2-162958

[51] Int. Cl.[5] .......................... H05K 7/12; H05K 7/16; E05C 3/30; G06F 1/00

[52] U.S. Cl. .................................... 361/395; 361/380; 292/228

[58] Field of Search ................ 364/708; 220/324, 326; 292/202, 228; 361/380, 392, 393, 394, 395, 399, 415

[56] References Cited

U.S. PATENT DOCUMENTS 767,045 8/1904 Vom Eigen .......................... 292/228
1,143,226 6/1915 Prahar .................................. 292/228
1,163,331 12/1915 Fuller .................................. 292/228
1,218,160 3/1917 Barler .................................. 220/326
2,059,821 11/1935 Spitalny .............................. 220/326
2,078,096 3/1936 Parkin ............................. 220/326 X
2,104,562 1/1937 Johnson .............................. 292/228
4,901,882 2/1990 Goncalves .......................... 220/324
4,951,241 8/1990 Hosoi et al. ......................... 364/708

*Primary Examiner*—Leo P. Picard
*Assistant Examiner*—Michael W. Phillips
*Attorney, Agent, or Firm*—Cushman, Darby & Cushman

[57] ABSTRACT

A portable computer includes a base unit having a keyboard and a display unit rotatably coupled to the base unit. The display unit is rotatable between a closed position where the keyboard is covered and an open position where the keyboard is exposed. A latch member is provided on the externally exposed area of the display unit and latched to an externally exposed area of the base unit when the display unit is rotated to a closed position. The latch member is so mounted on the display unit as to be rotated toward and away from the display unit. The latch member is normally urged in a direction to rotate into engagement with the base unit under an action of a latching spring. The latching spring maintains the latch member in an engaged relation to the base unit when the display unit is rotated to the closed position.

16 Claims, 10 Drawing Sheets

APPARATUS INCLUDING A ROTATABLE LATCH MECHANISM HAVING AN ATTACHING STRUCTURE FOR HOLDING A MOVABLE MEMBER IN A CLOSED POSITION

BACKGROUND OF THE INVENTION

1. Field of the Invention

The present invention relates to a latch mechanism for use in a portable electronic apparatus, such as a lap-top type computer and word processor. More particularly, this invention relates to a latch mechanism having a latch member which, in an apparatus including a display unit and a base unit having a keyboard, is brought into engagement with the base unit when the display unit is rotated to a closed position (i.e., a position covered keyboard) to hold the display unit in the closed position.

2. Description of the Related Art 2.

Recently, portable electronic apparatuses, such as a lap-top type portable computer and word processor having a keyboard and flat panel type display unit, have become increasingly popular.

This type of apparatus includes a base unit having a keyboard and flat panel type display unit supported on the base unit. The display unit is supported on the base unit and is rotatable, by a hinge mechanism, between a closed position where the keyboard is covered and an open position where the keyboard is exposed.

The display unit has a front surface exposed at the front end of the apparatus when it is rotated to the closed position. A latch mechanism is provided on the front surface of the display unit. A portable electronic apparatus including a latch mechanism is disclosed, for example, in U.S. patent application Ser. No. 07/542,041 filed Jun. 22, 1990 and U.S. patent application Ser. No. 07/542,248 filed Jun. 22, 1990. The latch mechanism includes a latch member made of an elastically deformable synthetic resin material and one end of the latch member is fixed by latch member is detachably latched to the front end of the base unit when the display unit is rotated to a closed position. By so doing, the display unit is held in the closed position.

In the conventional latch mechanism, the latch member and base unit are held in an engaged state under an elastic force of the latch member. Since the latch member is elastically deformed each time the display unit is closed or opened, it is necessary, from the viewpoint of the durability of the latch member, to increase the thickness of the latch member to some extent to enhance the rigidity of the latch member. An increase in the rigidity of the latch member necessarily leads to an increase in its own elastic force. When the display unit is rotated to the closed position, the latch member is reasonably engaged with the base unit and the display unit is positively held in the closed position without being loosened When the display unit is opened from the closed position, it is necessary to place the user's finger on the latch member and to force the latch member into deformation in a direction to disengage the latch member from the base unit. If, in this case, the latch member has a larger resiliency, a greater elastic force of the latch member acts as a greater resistance on his or her finger. Then, a heavier burden is imparted to his or her finger in the disengagement of the latch member from the base unit and hence an undue force is applied to his or her finger. Therefore, there is room for further improvement on the operability of the latch member as involved when the display unit is rotated to an open position.

SUMMARY OF THE INVENTION

It is accordingly the object of the present invention to provide a latch mechanism which can readily latch or unlatch a latch member to and from an engaging recess with less operation force without affecting the durability of the latch member.

According to the present invention, there is provided a latch mechanism including first and second members rotatably connectible to each other so that they can be held in a overlapped, compact state, comprising:

a latch member attached to the first member at an externally exposed area and rotatable toward and away from the first member, the latch member being brought into engagement with an externally exposed area of the second member when the first and second members are overlapped each other; and a latching spring for normally urging the latch member in a direction to allow it to be moved toward the second member, the latching spring enabling the latch member to be maintained in an engaged relation to the second member when the first and second members are overlapped each other.

In the arrangement shown, since the latch mechanism is rotatably attached to the first member, the latch member is rotated when the latch member is latched to, and unlatched from, the second member. Because the latch member is rotatable and unlike the prior art apparatuses, does not need to be deformed significantly when being latched to and unlatched from the second member, the force applied to the latch member when the latch member is latched to, and unlatched from, the second member is reduced. This extent of deformation is smaller than that of the conventional counterpart.

Further, when the latch member is unlatched from the second member with the user's finger caught on the latch member, an urging force of the latching spring acts mostly upon the finger of the user. It is possible, according to the present invention, to prevent any greater resistance from occurring when the latch member is disengaged from the second member and to do it so without the need to unduly deform the latch member.

Additional objects and advantages of the invention in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the .detailed description of the preferred embodiment given below, serve to explain the principles of the invention.

DETAILED DESCRIPTION OF THE PREFERRED EMBODIMENTS

Figure 1:
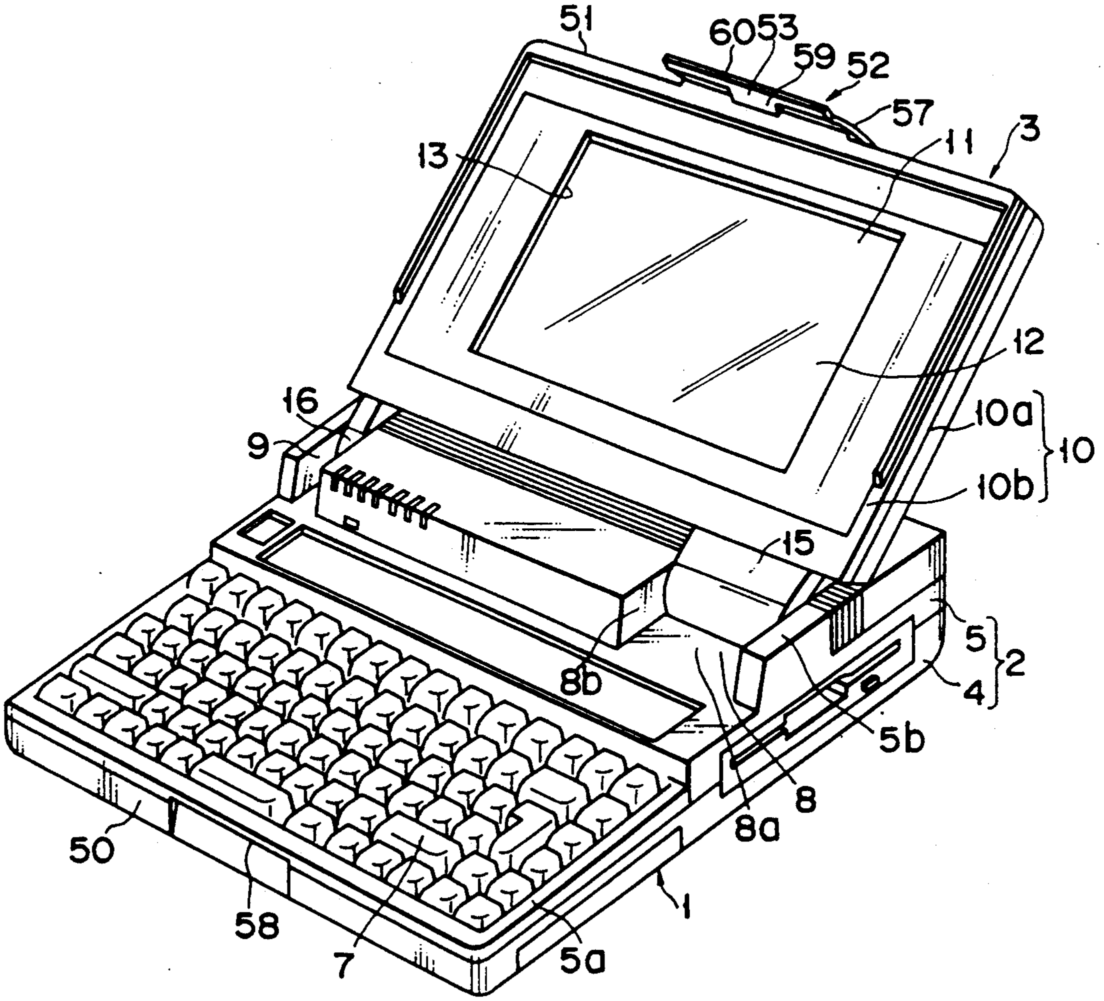
FIG. 1 is a perspective view showing a portable computer equipped with a latch mechanism of the present invention.

FIG. 1 shows a lap-top type portable computer 1. The portable computer 1 includes a base unit 2 and a flat panel type display unit 3. The base unit 2 comprises a bottom case 4, constituting a bottom plate, and a top cover 5.

The top cover 5 has a front portion 5*a* and a rear portion 5*b*. A keyboard 7 is mounted on the front portion 5*a* of the top cover 5. The rear portion 5*b* of the top cover 5 extends more upwardly than the keyboard 7. A pair of leg mounting recesses 8, 9 are provided one on the left side and one on the right side to support a display unit 3.

The display unit 3 includes a housing 10 and a flat liquid crystal display unit 11 held in the housing 10. The housing 10 comprises a base panel 10*a* and front panel 10*b*. The front panel 10*b* has an opening 13 for exposing a display screen 12 of the liquid crystal display unit 11. A first leg portion 15 and second leg portion 16 are provided on a housing 10 of the display unit 3. The leg portions 15 and 16 are inserted into the leg mounting recesses 8 and 9 and rotatably connected to the leg mounting recesses 8 and 9, respectively. By this connection, the display unit 3 is rotatable between a closed position where the keyboard 7 is covered and an open position where the keyboard 7 is exposed.

Figure 14:
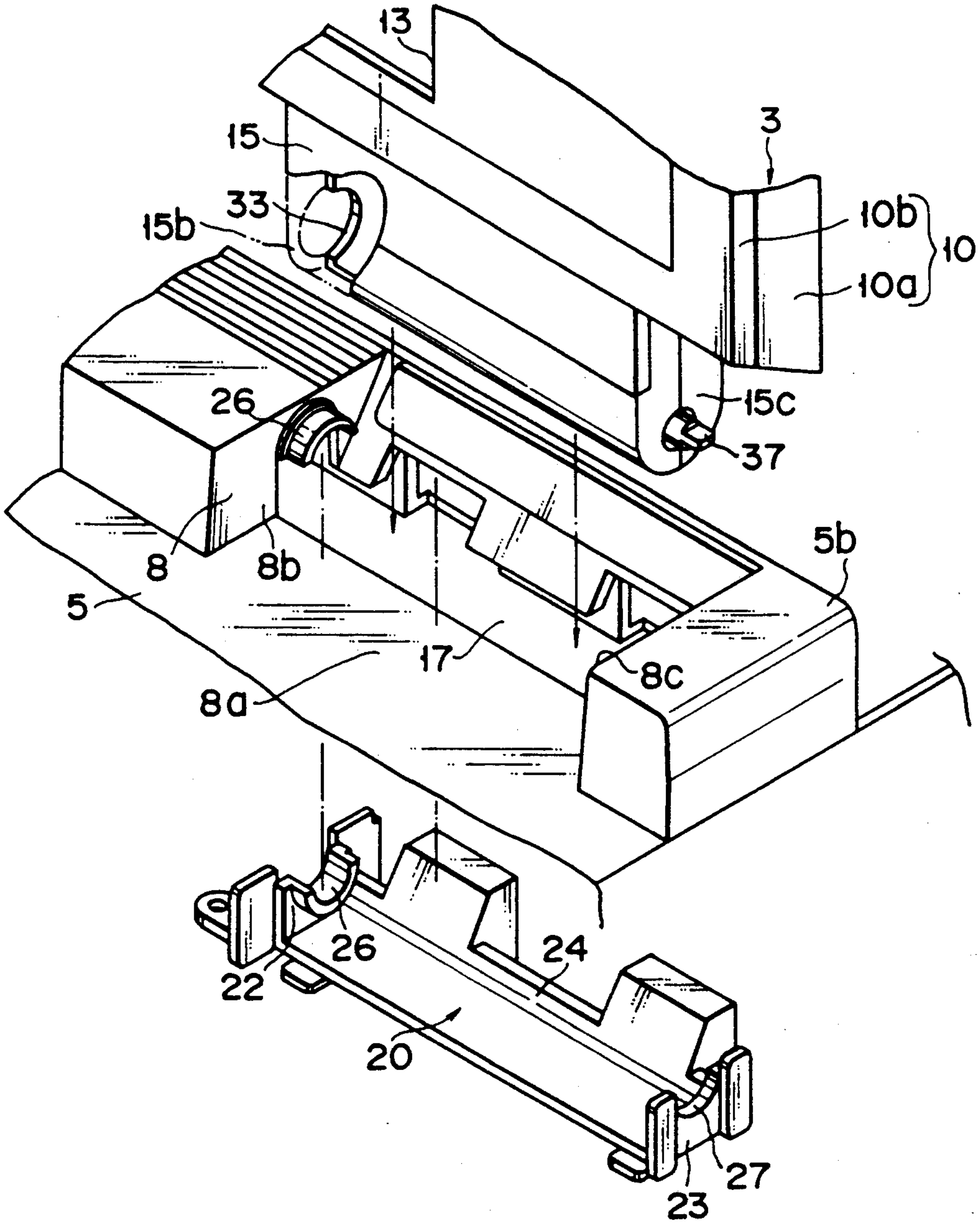
FIG. 14 is a perspective, exploded view showing a portion of the connection of the first leg portion of the display unit to the first mounting recess of the FIG. 15 is a cross-sectional view showing a portion of the connection of a second leg portion of the display unit to a second mounting recess of the base unit.

The leg mounting recess 8 in which the first leg portion 15 of the display unit 3 is inserted is wider in a lateral right/left direction than the leg mounting recess 9. As shown in FIG. 14, the leg mounting recess 8 has a bottom surface 8*a* and right and left side surfaces 8*b* and 8*c* continuous merging with the bottom surface 8*a*. An opening 17 is provided in the leg mounting recess 8 and opened into the top cover 5 in a manner to extend across the bottom surfaces 8*a* from one of the side surfaces 8*b* and 8*c* toward the other surface in a continuous way.

Figure 13:
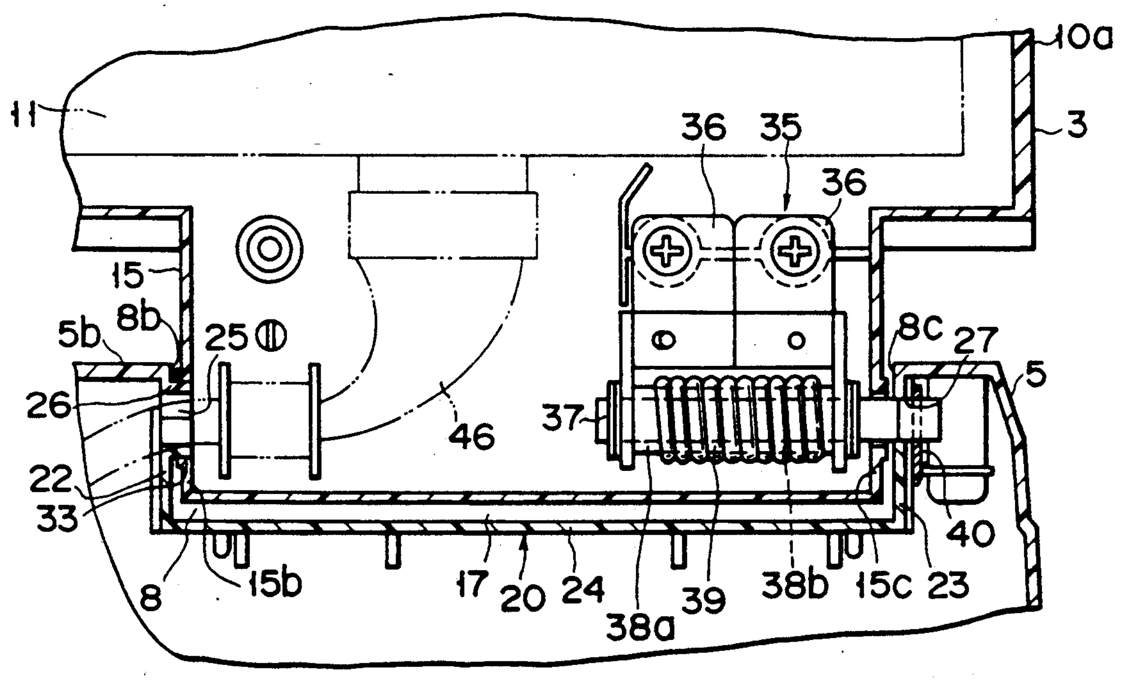
FIG. 13 is a cross-sectional view showing a portion of the connection of a first leg portion of the display unit to a first mounting recess of a base unit.

A cover 20 for covering the opening 17 is attached to the top cover 5. The cover 20 has opposite side walls 22 and 23 flush with the opposite side surfaces 8*b* and 8*c* of the leg mounting recess 8 and a bottom wall 24 connecting one of these side walls 22 and 23 to the other side wall. The side wall 22 provides a hollow shaft 26 having a guide passage 25, (as shown in FIG. 13) cooperating with the side surface 8*b*, and the side wall 23 provides an insertion hole 27 cooperating with the side surface 8*c*. The hollow shaft 26 is made coaxial with, and in an opposed relation to, the insertion hole 27.

Figure 15:
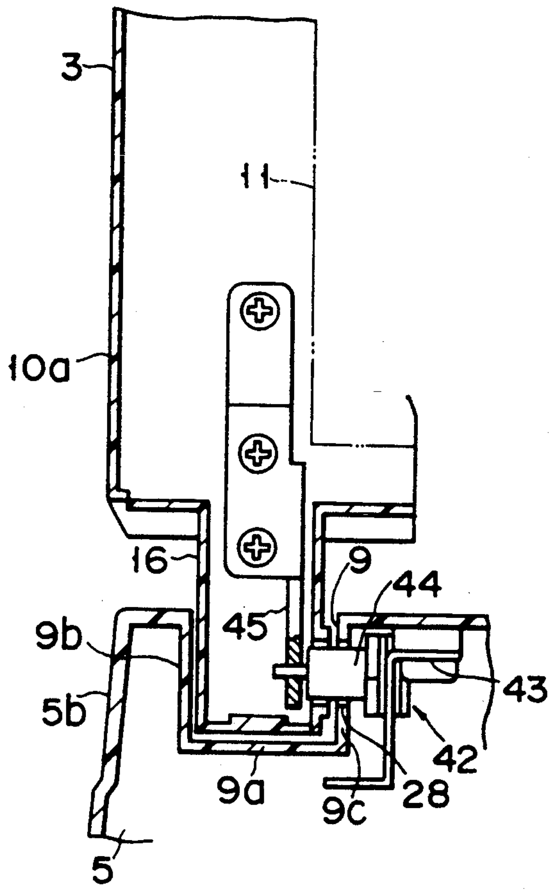

As shown in FIG. 15, the leg mounting recess 9 of the base unit 2 has a bottom surface 9*a* and opposite side surfaces 9*b* and 9*c* continuous with the bottom surface 9*a*. A through hole 28 opened into the top cover 5 is provided on the right side surface 9*c* of the leg mounting recess 9.

The first leg portion 15 has opposite surfaces 15*b* and 15*c* facing the side surfaces 8*b* and 8*c* of the leg mounting recess 8. A rotation hole 33 is provided in the surface 15*b* of the first leg portion 15 and a hollow shaft 26 is fitted into the hole 33 to allow a relative rotation to be made therebetween.

As shown in FIG. 13, the first leg portion 15 inserted into the leg mounting recess 8 is coupled to the top cover 5 by a first hinge brake mechanism 35. The first hinge brake mechanism 35 is held within the first leg portion 15 at a side opposite to that on which the rotation hole 33 is provided. The first hinge brake first leg portion 15. A hinge shaft 37 is supported by the brackets 36. A pair of sleeves 38*a*, 38*b* are mounted on the outer periphery of the hinge shaft 37 such that a relative rotation is allowed. The sleeves 38*a* and 38*b*, together with the brackets 36, are rotatable as one unit. A coil spring 39 is wound on the outer periphery surface of the sleeves 38*a* and 38*b*. One end of the hinge shaft 37 is inserted into the top cover 5 through the opposite surface 15*c* of the first leg portion 15 and through hole 27 of the right side surface 8*c* of the mounting recess 27 and engaged with a bracket metal 40. The bracket metal 40 is fixed in place in the top cover 5 and stops the hinge shaft 37 from being rotated. Upon rotation of the display unit 3 from a closed position to an open position, the sleeves 38*a* and 38*b* are rotated around the outer periphery of the hinge shaft 37. By so doing, one sleeve 38*a* is rotated in one direction to tighten the coil spring 39 while, on the other hand, the other sleeve 38*b* is rotated in a direction to slacken the coil spring 39. As a result, the coil spring 39 is tightly wrapped on the outer periphery of the sleeve 38*a* to generate a greater frictional force between the sleeve 38*a* and the coil spring 39. Upon rotation of the display unit 3 from the open position to the closed position, the sleeve 38*b* is rotated in a direction to tightly wrap the coil spring 39, causing a greater frictional force therebetween. As a result, the display unit 3 is suppressed from being freely rotated so that the display unit 3 is held at any position between the closed position and the open position.

As shown in FIG. 15, the second leg portion 16 inserted into the leg mounting recess 9 is rotatably mechanism 42. The second hinge brake mechanism 42 is held in place in the top cover 5. The second hinge brake mechanism 42 includes a bracket 43 fixed to the top cover 5 and a hinge shaft 44 rotatably supported on a bracket 43. The hinge shaft 44 is inserted into the second leg portion 16 through the through hole 28 in the right side surface 9c of the leg mounting recess 9. A bracket metal 45 is fixed in place in the second leg portion 16. The bracket metal 45 is engaged with the hinge shaft 44 so that the hinge shaft 44 and second leg portion 16 are rotated as one unit.

As shown in FIG. 13, a printed circuit board, not shown, held in place in the base unit 2 is electrically connected to the liquid crystal display unit 11 in the display unit 3 through a cable 46. The cable 46 extends from within the base unit 2 past a guide passage 25 in the leg mounting recess 8 and then past the rotation hole 33 into the first leg portion 15.

Figure 2:
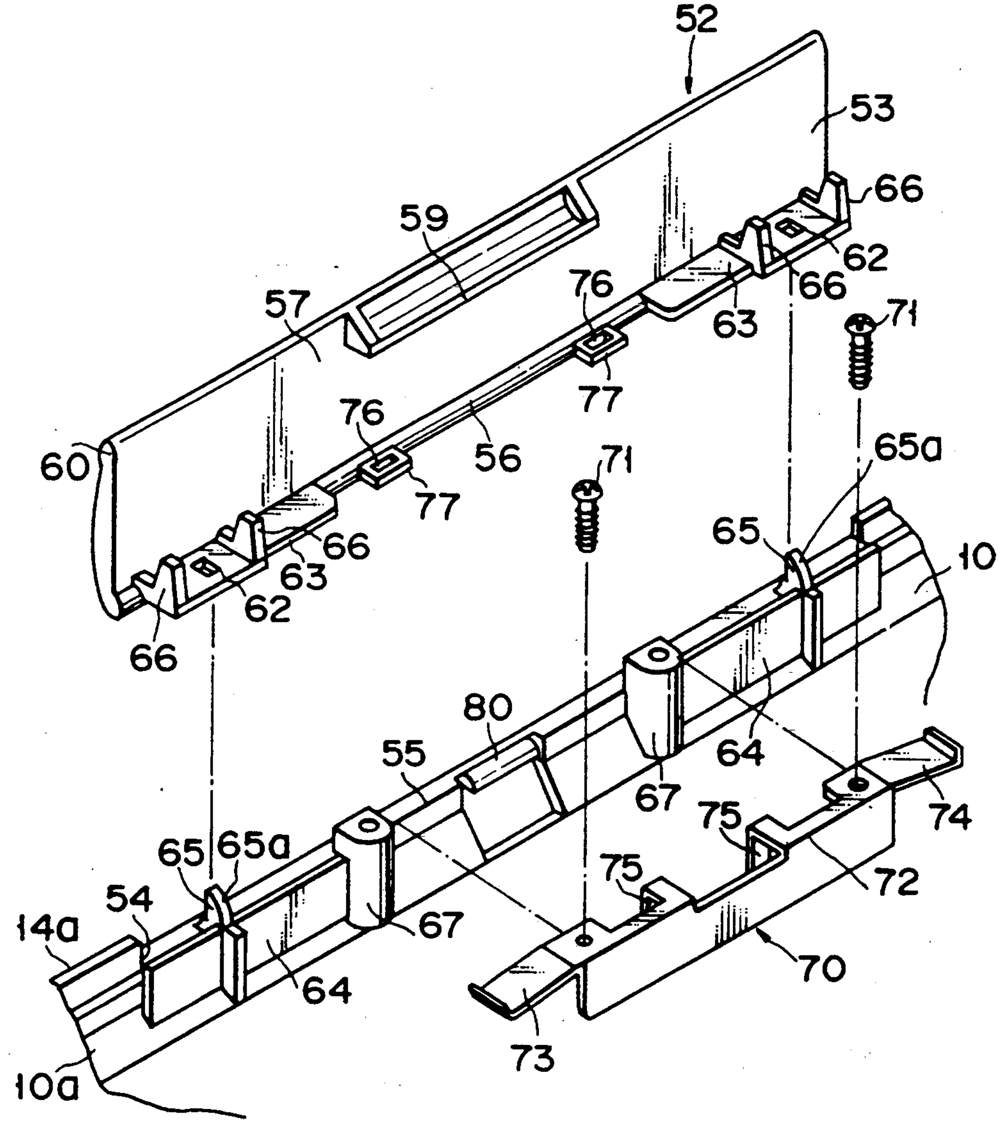
FIG. 2 is a perspective, exploded view showing a of a display unit.
Figure 3:
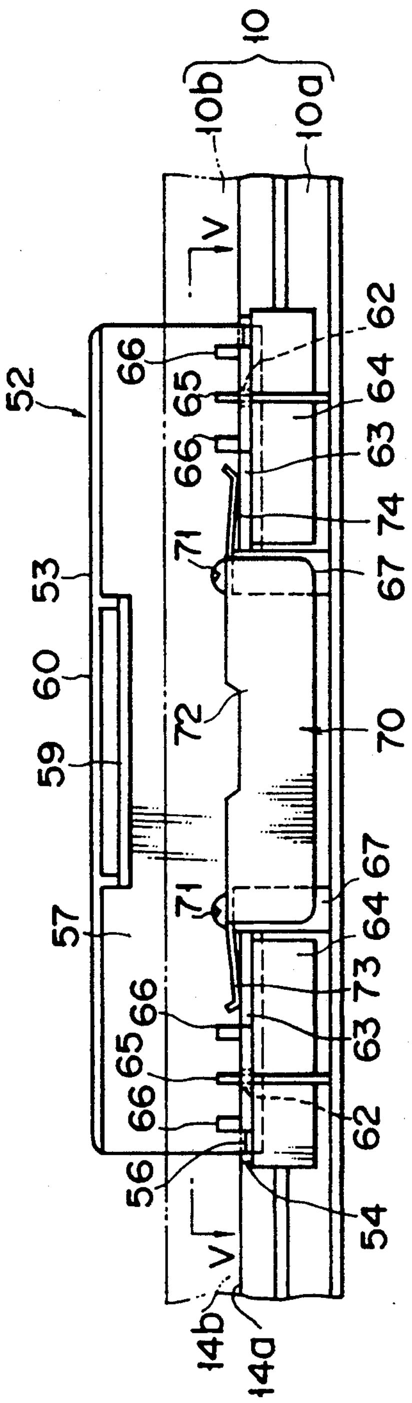
FIG. 3 is a side view showing the latch member and latching spring as mounted on the housing of the display unit.
Figure 4:
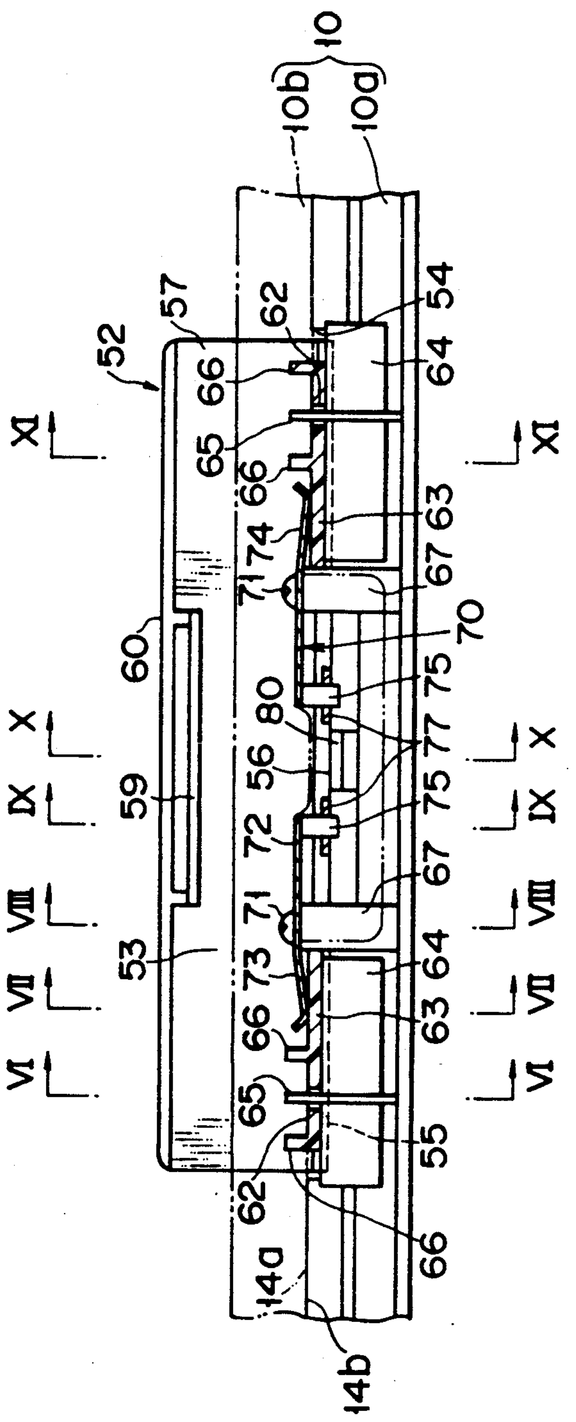
FIG. 4 is a cross-sectional view showing the latch member and latch spring as mounted on the housing of the display unit.
Figure 5:
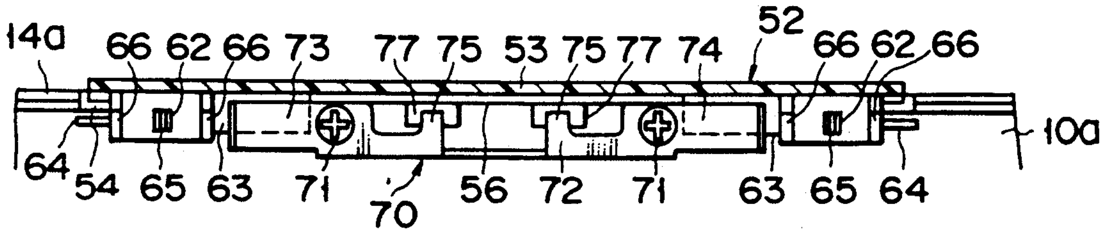
FIG. 5 is a cross-sectional view taken along line V—V in FIG. 3.
Figure 12:
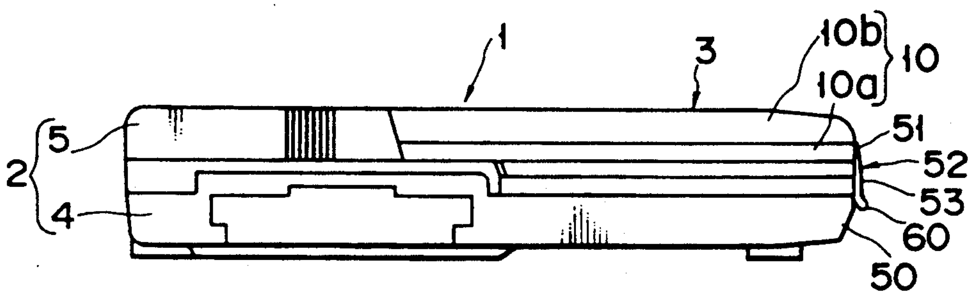
FIG. 12 is a side view of the portable computer with the display unit rotated to a closed position.

As shown in FIG. 1, the base unit 2 has a front surface 50 exposed at a front end of the portable computer 1. The housing 10 of the display unit 3 has an exposed surface 51 which, upon rotation of the display unit 3 to the closed position, emerges as a front end continuous with the front surface 50 of the base unit 2. A latch mechanism 52 is exposed at the middle portion of the front surface 52 to hold the display unit 3 in the closed position. The latch mechanism 52 has a latch member 53 made of an elastically deformable synthetic resin material. The latch member 53 is formed of an elongate plate extending in a lateral right/eft direction along the front surface 51 of the housing 10. As shown in FIGS. 2 and 3, a shaft section 56 circular in crosssection is formed on one side edge portion of the latch member 53 and fitted at an area between the base panel 10a and the front panel 10b of the housing 10. As shown in FIG. 3 base panel 10a and front panel 10b have edge portions 14a and 14b, respectively, which face each other. A recess 54 is provided at the edge portion 14a of the base panel 10a to position the latch mechanism 50 at the middle portion of the front surface 51 (see FIG. 1). The recess 54 has a bottom surface 55 (see FIG. 2) engaged by the shaft section 56 of the latch member 53. The other side edge portion of the latch member 53 is projected from the front surface 51 of the housing 10 (see FIG. 1). The projection 57 of the latch member 53 is fitted over the front surface 50 (see FIG. 1) of the base unit 2 upon rotation of the display unit 3 to the closed position. As shown in FIG. 1, engaging recess 58 is provided at that front surface 50 of the base unit 2 where the projection 57 is fitted as set out above. An engaging hook 59 is provided at the projection 57 of the latch member 53 and, upon rotation of the display unit 3 to the closed position, is engaged with the engaging recess 58 to hold the display unit 3 in the closed position. The forward end edge of the projection 57 provides a finger engaging portion 60. Upon rotation of the display unit 3 to the closed position, the finger engaging portion 60 is bent in a direction away from the front surface 50 of the base unit 2 as shown in FIG. 12 so that the user can readily place his or her finger on the finger engaging portion 60.

As shown in FIGS. 2 and 3, a pair of spring receiving portions 63 are provided for the shaft section 56 of the latch member 53 and each have a guide hole 62 therein. The spring receiving portions 63 are each located at each end portion of the latch member 53 and spaced-apart in relation to the axial direction of the shaft section 56. The spring receiving portion 63 extends via the recess 54 into the base panel 10a and a support wall 64 is provided in the base panel 10a. The support wall 64 is placed in contact with the lower surface of the spring receiving portion 63. The spring receiving portion 63 is retained relative to the edge portion 14b of the front panel 10b. By so doing the shaft section 56 of the latch member 53 is pushed onto the bottom surface 55 of the recess 54 and can be rotated toward and away from the front surfaces 50 and 51 of the base 2 and, respectively, (see FIG. 1) with the shaft section 56 as a fulcrum.

As shown in FIGS. 2 and 3, a pair of guide projections 65 are provided on the bottom surface 55 of the recess 54. The guide projections 65 extend through the corresponding guide holes 62 of the latch member 53. The edge portions 65a of the guide projections 65 are circularly curved such that, upon rotation of the latch member 53 with the shaft section 56 as a center, the edge portions follow the loci of rotation described at a location of guide hole 62 of the latch member 53. As a result, the latch member 53 has its direction of rotation guided by the guide projections 65.

Figure 6:
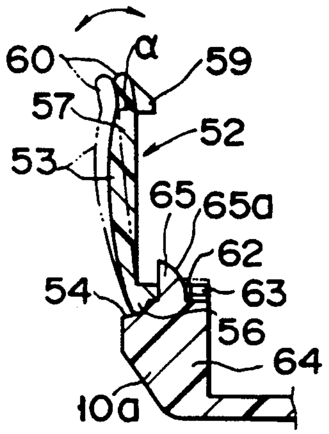
FIG. 6 is a cross-sectional view taken along line VI—VI in FIG. 4.
Figure 7:
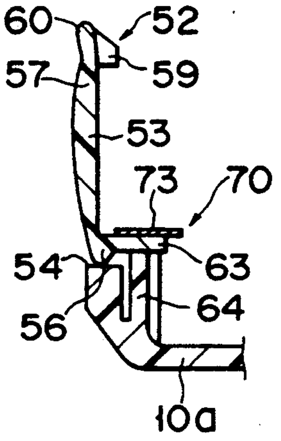
FIG. 7 is a cross-sectional view taken along line VII—VII in FIG. 4.
Figure 8:
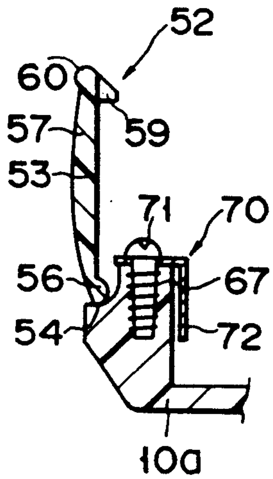
FIG. 8 is a cross-sectional view taken along line VIII—VIII in FIG. 4.
Figure 9:
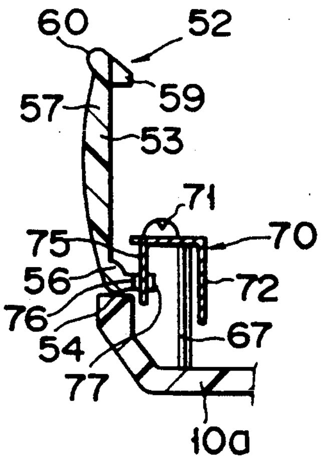
FIG. 9 is a cross-sectional view taken along line IX—IX in FIG. 4.
Figure 11:
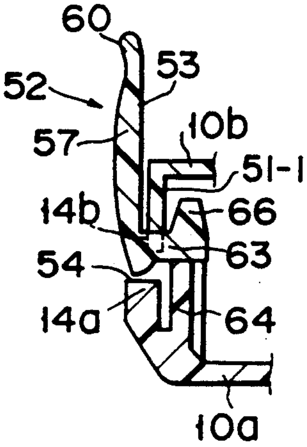
FIG. 11 is a cross-sectional view taken along line XI—XI in FIG. 4.

A pair of stoppers 66 project relative to the spring receiving portion 63. As shown in FIG. 11, the forward end of the stopper 66 is located inside the edge portion 14b of the front panel 10b and, upon rotation of the latch member 53 away from the front surfaces 50, 51 of the housing 10, makes contact with the inside surface 51-1 of the front panel 10b, thereby restricting a maximum angle a (see FIG. 6) of rotation of the latch member 53.

As shown in FIGS. 2 and 3, a pair of spring supports 67 are provided inside the base panel 10a and made continuous with the recess 54 at a location defined between the support walls 64. The spring supports 67 extend toward the front panel 10b further than the bottom surface 55 of the recess 54. A latching spring 70 is fixed in place over the length between the spring supports 67. The latching spring 70 is formed of a bent thin metal plate and comprises a fixing section 72 fixed by a screws 71 to the spring supports 67 and a pair of tongues 73, 74 each extending out from each end of the fixing section 72. The tongues 73, 74 have an elastic property and are placed in contact with the spring receiving portions 63 of the latch member 53 in a manner to urge the spring receiving portions 63 toward support walls 64. By so doing, the latch member 53 is so urged as to normally rotate toward the front surface 50, 51 of the housing 10 (see FIG. 12) with the shaft section 56 as a fulcrum.

A pair of engaging sections 75 are provided integral with the fixing section 72 of the latching spring 70 and so located between the tongues 73 and 74 as to extend toward the shaft section 56. As shown in FIG. 2, pair of projections 77 are provided at the shaft section 56 and have a through hole 76 each. The projections 77 are spaced apart in the axial direction of the shaft section 56 and the engaging sections 75 of the latching spring 70 are inserted into the through holes 76 of the projections 77. Since the latching spring 70 is also latched to the shaft section 56 of the latch member 53, it is possible to prevent a displacement of the shaft section 56 in the recess 54 of the housing 10.

Figure 10:
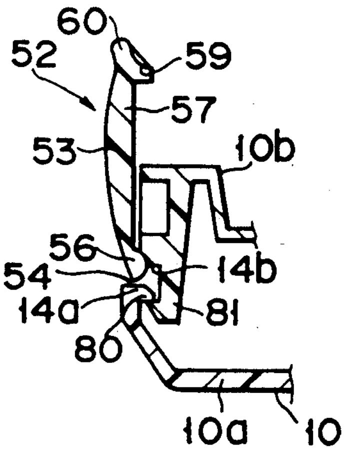
FIG. 10 is a cross-sectional view taken along line X—X in FIG. 4.

As shown in FIG. 10, first and second engaging hooks 80 and 81 are provided at the edge portions 14a and 14b of the base panel 10a and front panel 10b, respectively, such that they are located at the middle portion of the recess 54 of the housing 10. The first and second engaging hooks 80 ad 81 are engaged with each other to couple the front panel 10b and the base panel 10a.

The operation of the latch mechanism 52 will be explained in more detail below with reference to FIGS. 1—3 and 12.

Upon rotation of the display unit 3 from the open position to the closed position, the engaging hook 59 of the latch member 53 is first brought into contact with the front surface 50 of the base unit 2, causing the latch member 53 to rotate away from the front surface 51 of the display unit 3 against an urging force of the latching spring 70. Further rotation of the display unit 3 allows the engaging hook 59 of the latch member 53 to reach the position of the engaging recess 58 of the base unit 2. When this occurs, the latch member 53 is forcibly rotated toward the front surface 50 urging force of the latching spring 70 with the shaft section 56 as a fulcrum, latching the latching hook 59 to the engaging recess 58. By so doing, the display unit 3 is held in the closed position and, as shown in FIG. 12, the portable computer 1 is made a flat, compact and portable unit as a whole.

To return the display unit 3 to an open position referring to FIGS. 1-3 and 12, the user first hooks his or her finger on a finger engaging section 60 of the latch member 53 and raises the latch member 53 away from the front surface 50 of the base unit 2. Then the latch member 53 is rotated against an urging force of the latching spring 70 with the shaft section 56 as a fulcrum, allowing the latching hook 59 to be detached away from the engaging recess 58 so that the display unit 3 can be rotated to an open position.

The portable computer 1 thus arranged has the following advantages.

The latch member 53 for holding the display unit 3 in the closed position is rotatably supported on the housing 10 of the display unit 3. For this reason, the latch member 53 is rotated when the latching hook 59 of the latch member 53 is engaged with, and disengaged from, the engaging recess 58 of the base unit 2. At that time, a force as applied to the latch member 53 is released by the rotation of the latch member 53 so that the extent of deformation of the latch member 53 is smaller than that of the conventional counterpart.

Thus no undue force is applied to the latch member 53 and high indurance can be imparted to the latch member 53 without thickening the latch member 53.

Further, since the latch member 53 and engaging recess 58 can be maintained in their engaged relation by the urging force of the latch spring 70, even if the latch member 53 has its own small elastic force, the latch member 53 can be positively maintained in an engaged relation to the engaging recess 58 and hence the display unit 3 can be held in a closed relation without being loosened.

When the latch member 53 is disengaged from the engaging recess 58, a force acting upon the user's finger comes almost primarily from the latch spring 70 and it is not necessary to unduly deform the latch member 53 at that time. For this reason, it is possible to prevent any greater resistance from occurring when the latch member 53 is disengaged from the engaging recess 58 and hence to readily disengage the latch member 53 from the engaging recess 58 with less operation force.

The latch mechanism of the present invention can equally be applied not only to a portable electronic apparatus, such as a portable computer and word processor, but also to an apparatus in various fields of art.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A latch mechanism comprising:
- first and second members rotatably coupled to each other to rotate in an overlapped, compact state, the first member comprising a pair of panels having mutually mating edges;
- a latch member attached to the first member at an externally exposed surface and rotatable toward and away from the first member, the latch member being brought into engagement with an externally exposed surface of the second member when the first and second members overlap each other, the latch member comprising:
- a shaft section rotatable between the mating edges of the panels with the shaft section serving as a rotation fulcrum of the latch member; and
- a pair of spring receiving portions extending from the shaft section toward an inside of the first member past the mating edges of the panels, the pair of spring receiving portions being spaced apart along the axis of rotation of the shaft section; and
- spring means normally urging the latch member in a direction toward the second member, the spring means keeping the latch member engaged with the second member when the first and second members overlap each other, the said spring means comprising:
- a fixing section fixed to one of the panels at an area defined between the spring receiving portions; and
- a pair of elastic tongues contacting the spring receiving portions to push the shaft section against the engaging edge of said one of the panels.

2. The latch mechanism according to claim 1, wherein, when said first and sεcond members overlap each other, their exposed surfaces provide a single, continuously joined, exposed front end, and said latch member is rotatably mounted on the exposed surface of the first member and has a latching hook for engaging the exposed surface of the second member when the first and second members are overlap each other.

3. The latch mechanism according to claim 2, wherein an engaging recess is provided on the exposed surface of the second member to allow a latching hook to be brought into engagement therewith.

4. The latch mechanism according to claim 1, wherein said tongues and fixing section are integral with each other and comprise a bent thin metal plate.

5. The latch mechanism according to claim 4, wherein said fixing section includes a pair of engaging sections extending toward the shaft section of the latch member and these engaging sections are latched to the shaft section of the latch member at an area defined between the tongues.

6. The latch mechanism according to claim 1, wherein a recess is provided at the edge portion of one of the pair of panels to receive the shaft section, the recess being provided adjacent the shaft section and having a bottom surface facing the spring receiving portions, and a pair of guide projections are provided on the bottom surface and penetrate the spring receiving portions to guide the rotation of the latch member.

7. The latch mechanism according to claim 1, wherein the spring receiving portions each have a stopper extending toward an inside of the other one of the pair of panels, said other panel having an inner surface facing the stoppers, and, when the latch member is rotated away from said other panel against an urging force of the spring means, the stoppers are engaged with the inner surface of said other panel to restrict a maximum rotation angle of the latch member.

8. The latch mechanism according to claim 2, wherein said latch member comprises an elastic synthetic resin and a flat plate extending along the exposed surface of the first member.

9. A latch device, comprising:

a first unit comprising first and second panels having mutually mating edge portions;

a second unit, rotatably coupled to said first unit, rotating to overlap said first unit;

a latch member, rotatably coupled to said first unit, comprising:

a shaft section rotatably sandwiched between the mating edge portions of said first and second panels to act as a fulcrum when the latch member rotates;

a spring-receiving portion extending from said shaft section into an inside of said first unit; and a latching hook engaging with an exposed surface of said second unit when said first unit overlaps said second unit; and a leaf spring urging said latch member to rotate in a direction to engage with said second unit when said first unit overlaps said second unit, said leaf spring comprising;

a fixing section fixed to said first panel;

at least one spring member contacting said spring receiving portion and elastically deforming to press said shaft section against said mating edge portion of said first panel; and an engaging section engaging with said shaft section to secure the latch to said first panel.

10. The latch device according to claim 9, wherein the edge portion of said first panel has a recess for rotatably receiving said shaft section, said recess having a bottom surface comprising a guide projection extending through said spring receiving portion to guide rotation of said latch member.

11. The latch device according to claim 10, wherein said guide projection has an edge portion curving about said shaft section when said guide projection extends through said spring receiving portion.

12. The latch device according to claim 9, wherein said spring receiving portion comprises a stopper extending along an inside of said second panel, said second panel having an inner surface facing said stopper, said stopper engaging with said inner surface of said second panel when said latch member rotates against said urging of said leaf spring to define a maximum rotating angle of said latch member.

13. The latch device according to claim 9, wherein said latch member comprises a finger engaging portion at an end portion of said latch member opposite to said shaft section.

14. The latch device according to claim 9, wherein said shaft section comprises a projection having a through hole, said engaging section inserting into said through hole.

15. The latch device according to claim 9, wherein the latch member further comprises, a second spring receiving portion extending from said shaft section into said inside of said first unit and disposed apart from said spring receiving portion along an axial direction of said shaft section, each of said spring members contacting a corresponding one of said first and second spring receiving portions, respectively; and said fixing section and said engaging section being disposed between said two spring members.

16. A portable computer comprising:

a base unit having a keyboard;

a display unit rotatably connected to said base unit, said display unit rotating between a closed position wherein said display unit overlaps the base unit to cover the keyboard and an open position wherein said keyboard is exposed, said display unit comprising:

a front panel facing the keyboard when said front panel is rotated to the closed position; and a base panel attached to said front panel, said front panel and said base panel having mutually mating edge portions;

a latch member coupled to said display unit, said latch member comprising:

a shaft section rotatably sandwiched between said edge portions of said front panel and said base panel and acting as a fulcrum when said latch member rotates;

at least one spring receiving portion extending from said shaft section into an inside of said display unit; and a latching hook engaging with an exposed surface of said base unit; and a leaf spring urging said latch to rotate in a direction to engage said latch member with said base unit when said display unit is in said closed position, said leaf spring comprising:

a fixing section fixed to said base panel;

at least one spring member contacting said spring receiving said spring receiving portion and elastically deforming to cause said shaft portion to press against the edge portion of said base panel; and and engaging section enagaging with said shaft section to secure said latch member to said base panel.

* * * * *